United States Patent
Theeuwen et al.

(10) Patent No.: US 7,576,387 B2
(45) Date of Patent: Aug. 18, 2009

(54) MOS TRANSISTOR AND METHOD OF MANUFACTURING A MOS TRANSISTOR

(75) Inventors: Stephan Jo Cecil Henri Theeuwen, Nijmegen (NL); Johannes Adrianus Maria De Boet, Beuningen (NL); Jos Gerjan Eusebius Klappe, Nijmegen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 12/097,582

(22) PCT Filed: Dec. 12, 2006

(86) PCT No.: PCT/IB2006/054753

§ 371 (c)(1),
(2), (4) Date: Jun. 16, 2008

(87) PCT Pub. No.: WO2007/069188

PCT Pub. Date: Jun. 21, 2007

(65) Prior Publication Data

US 2008/0308862 A1  Dec. 18, 2008

(30) Foreign Application Priority Data

Dec. 14, 2005 (EP) .................................. 05112108

(51) Int. Cl.
*H01L 29/78* (2006.01)

(52) U.S. Cl. .............................. 257/328; 257/E29.256; 257/E21.417; 438/294

(58) Field of Classification Search ................. 257/328, 257/E29.256, E21.417; 438/294
See application file for complete search history.

(56) References Cited

U.S. PATENT DOCUMENTS 7,148,540 B2 * 12/2006 Shibib et al. ................ 257/336
2005/0156234 A1 * 7/2005 Gammel et al. ............. 257/335

FOREIGN PATENT DOCUMENTS

| EP | 0069429 A2 | 1/1983 |
| EP | 1691419 A2 | 8/2006 |
| WO | 9956311 A1 | 11/1999 |
| WO | 03038905 A2 | 5/2003 |
| WO | 2005022645 A2 | 3/2005 |
| WO | 2007007273 A2 | 1/2007 |

OTHER PUBLICATIONS

Fujishima, N; et al "A 700V Leteral Power MOSFET With Narrow Gap Double Metal Field Plates Realizing Low on-Resistance and Long-Term Stability of Performance" Proceedings of the 13th International Symposium on Power Semiconductor Devices and ICS (ISPSD '01), Osaka, JP, Jun. 7, 2001, pp. 255-258.

* cited by examiner

*Primary Examiner*—Trung Dang

(57) ABSTRACT

The MOS transistor (1) of the invention comprises a gate electrode (10), a channel region (4), a drain contact region (6) and a drain extension region (7) mutually connecting the channel region (4) and the drain contact region (6). The MOS transistor (1) further comprises a shield layer (11) which extends over the drain extension region (7) wherein the distance between the shield layer (11) and the drain extension region (7) increases in a direction from the gate electrode (10) towards the drain contact region (6). In this way the lateral breakdown voltage of the MOS transistor (1) is increased to a level at which the MOS transistor (1) may fulfill the ruggedness requirement for broadcast applications for a supply voltage higher than that used in base station applications.

12 Claims, 6 Drawing Sheets

MOS TRANSISTOR AND METHOD OF MANUFACTURING A MOS TRANSISTOR

In base stations for personal communications systems (GSM, EDGE, W-CDMA), the RF power amplifiers are the key components. For these power amplifiers, RF Metal Oxide Semiconductor (MOS) transistors are now the preferred choice of technology, because these are able to provide for excellent high power capabilities, gain and linearity. These MOS transistors are not only used in base stations but also in radar and broadcast applications. Broadcast applications have a higher power level and a lower load resistance than base station applications. A way to increase the load resistance is by enabling a high supply voltage operation. The advantage of a higher supply voltage and a higher load resistance is that the output circuitry matching at higher supply voltages is less critical. This results in a more reliable circuit (with less heating of the matching components) and in amplifiers with a power above 300 W, which is requested by the market. These matching advantages and power advantages in broadcast applications are also applicable for base station applications.

For broadcast applications the bandwidth is a crucial parameter, requiring a typical bandwidth of 450 MHz (450-900 MHz operation range) for Ultra High Frequency (UHF) and about 200 MHz for Very High Frequency (VHF) applications. The UHF value is about a factor of 10 larger than for the W-CDMA signals that are typical in base station applications. Another important parameter for broadcast applications is ruggedness, which is the ability of the MOS transistor to withstand a mismatch condition at a certain power level. The ruggedness requirement of the MOS transistor used in broadcast applications is more severe than the standard requirements for ruggedness in base station applications, because the MOS transistor used in broadcast applications should be able to withstand a switching at a high power level. To fulfill this more severe ruggedness requirement for broadcast applications, the lateral breakdown voltage in the MOS transistor should be more than 20% above the maximum applied drain voltage, which is about twice the supply voltage.

In WO 2005/022645 an LDMOS (Laterally Diffused MOS) transistor is disclosed, which is provided on a semiconductor substrate comprising a source and a drain region, that are mutually connected through a laterally diffused channel region, and a gate electrode for influencing an electron distribution in the channel region. The drain region comprises a drain contact region and a drain extension region extending in the semiconductor substrate from the drain contact region towards the channel region. A shield layer with a stepped structure is provided between the gate electrode and the drain contact region extending over a part of the drain extension region to shield a part of the gate electrode and the drain region.

The lateral breakdown voltage of an MOS transistor is defined as the drain voltage, while applying zero volts on the gate and the source, for which the drain to source current is larger than a specific (low) value, for example 0.01 mA per mm gate width. Typically the lateral breakdown voltage of this LDMOS transistor, which is used in base station applications, is around 70V to 75V at a supply voltage of 32V. However the lateral breakdown voltage of the LDMOS transistor, which is used in broadcast applications at a higher supply voltage of 40V, should be more than 88V to provide the required ruggedness for broadcast applications. Hence, the disadvantage of the known LDMOS transistor is that it does not fulfill the required ruggedness requirement for broadcast applications.

It is an object of the invention to provide a MOS transistor that fulfills the ruggedness requirements for broadcast applications. According to the invention, this object is achieved by providing a MOS transistor as claimed in claim 1.

The shield layer of the MOS transistor according to the invention is of an electrically conductive material and extends at least over a part of the drain extension region. A distance between the shield layer and the drain extension region increases in a direction from the gate electrode towards the drain contact region, the shield layer thereby influencing the distribution of the lateral electric field in the drain extension region in such a way that the lateral breakdown voltage of the MOS transistor is increased to a level at which the MOS transistor may fulfill the ruggedness requirement for broadcast applications for a supply voltage higher than that used in base station applications. Furthermore, it appears that also the bandwidth requirements for broadcast applications may be met by the MOS transistor according to the invention.

In an embodiment of the MOS transistor according to the invention, the shield layer comprises a multiple of portions extending over the drain extension region essentially parallel to a top surface of the drain extension region, in which a second distance between the drain extension region and a second portion of the shield layer is larger than a first distance between the drain extension region and a first portion of the shield layer, which first portion is closer to the gate electrode than the second portion of the shield layer. This embodiment allows for easy and simple fabrication of the MOS transistor according to the invention.

In another embodiment of the MOS transistor according to the invention, the shield layer comprises a multiple of stacked shield sub-layers, in which a second shield sub-layer extends over a first shield sub-layer and is separated from the first shield sub-layer by an isolation layer, and in which the second shield sub-layer extends over a larger part of the drain extension region than the first shield sub-layer. Furthermore a second distance between the second shield sub-layer and the drain extension region is larger than a first distance between the first shield sub-layer and the drain extension region. This embodiment provides for an even simpler fabrication of the MOS transistor according to the invention.

In an embodiment of the MOS transistor according to the invention the shield layer also extends over a part of the gate electrode. In this way it is ensured that the shield layer extends over a part of the drain extension region that is adjacent to the gate electrode, without being influenced by the accuracy of the fabrication method that determines the exact position of the shield layer with respect to the gate electrode.

In another embodiment the shield layer also extends over a part of the source region. This enables to provide for an electrical contact on a part of the shield layer that extends over the source region.

In an embodiment, the MOS transistor further comprises a substrate contact region, which is adjacent to the source region, wherein the substrate contact region and the source region are electrically connected via a first interconnect layer. This embodiment enables a low resistance electrical connection between the substrate and the source region while the shield layer extends over the source region.

In another embodiment, the shield layer is electrically connected to the source region. This advantageously reduces the amount of voltages that needs to be applied to the MOS transistor.

A method of manufacturing the MOS transistor according to the invention comprises the step of providing a semiconductor substrate region in which a source region, a channel region, a drain extension region and a drain contact region are provided, wherein the drain extension region mutually connects the drain contact region and the channel region, and wherein the channel region mutually connects the drain extension region and the source region. The method further comprises the steps of forming a gate oxide layer on the semiconductor substrate region and forming a gate electrode, extending over the channel region, on a first portion of the gate oxide layer. Subsequently an isolation region is formed on a third portion of the gate oxide layer and extending over a part of the drain extension region. The third portion of the gate oxide layer is separated from the first portion of the gate oxide layer by a second portion of the gate oxide layer, and the isolation region has a thickness that increases in a direction from the gate electrode towards the drain contact region. Then a shield layer of an electrically conductive material is formed extending at least over a part of the second portion of the gate oxide layer and at least over a part of the isolation region. This method advantageously forms an MOS transistor with an increasing distance between the shield layer and the drain extension region, which increasing distance is provided for by the isolation region which has a thickness that increases in a direction from the gate electrode towards the drain contact region.

These and other aspects of the invention will be further elucidated and described with reference to the drawings, in which.

Figure 8A:
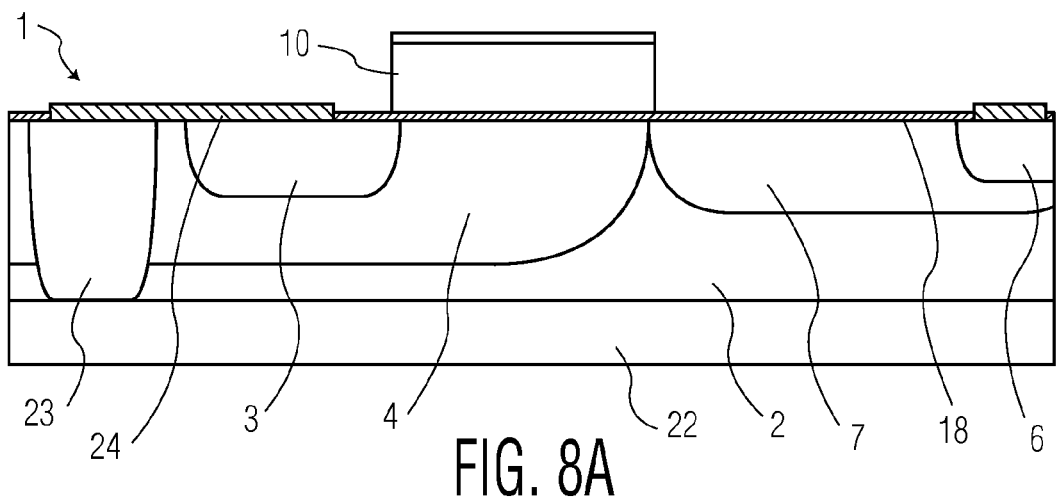
Figure 8B:
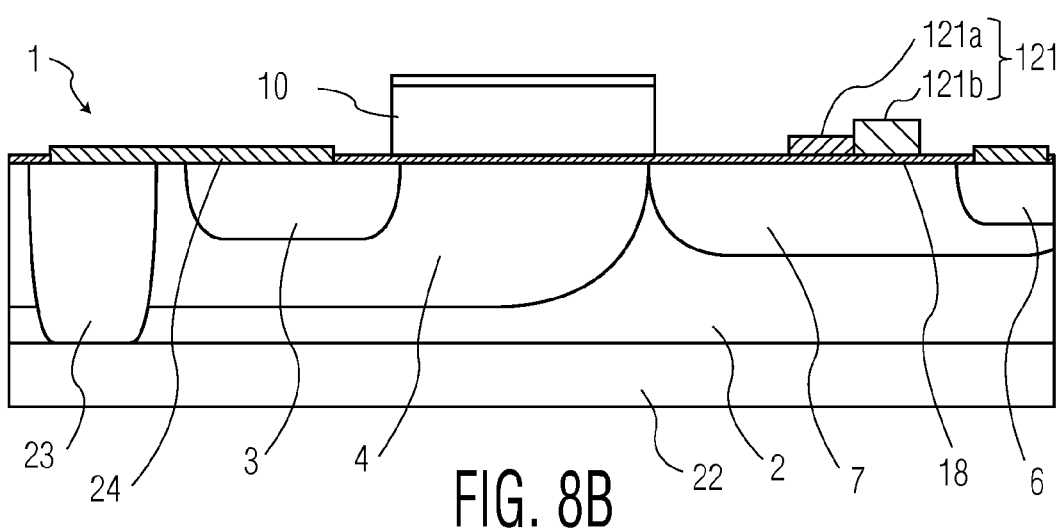
Figure 8C:
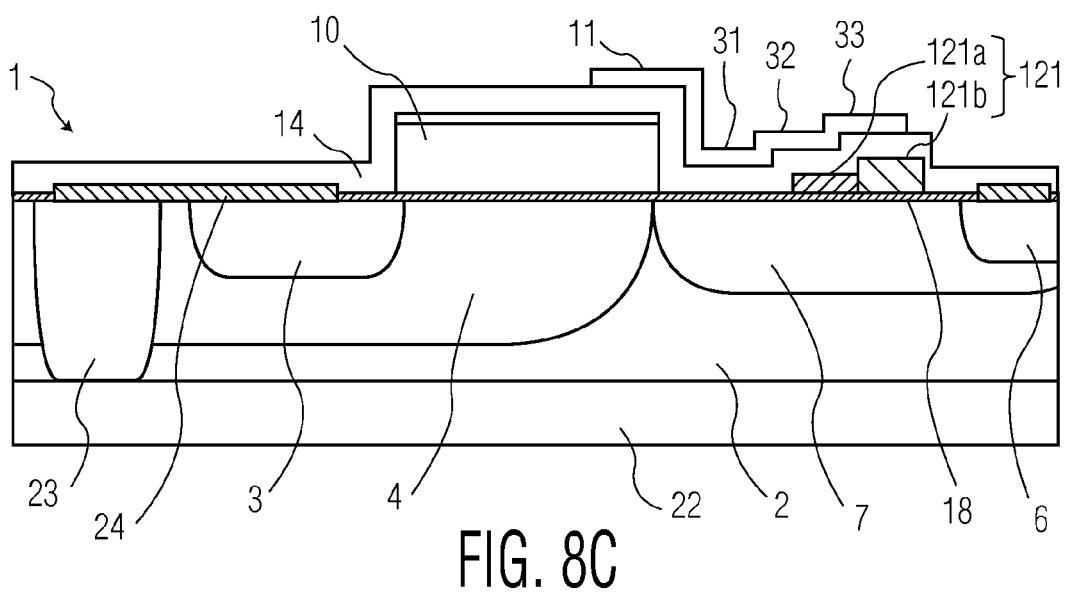
Figure 9:
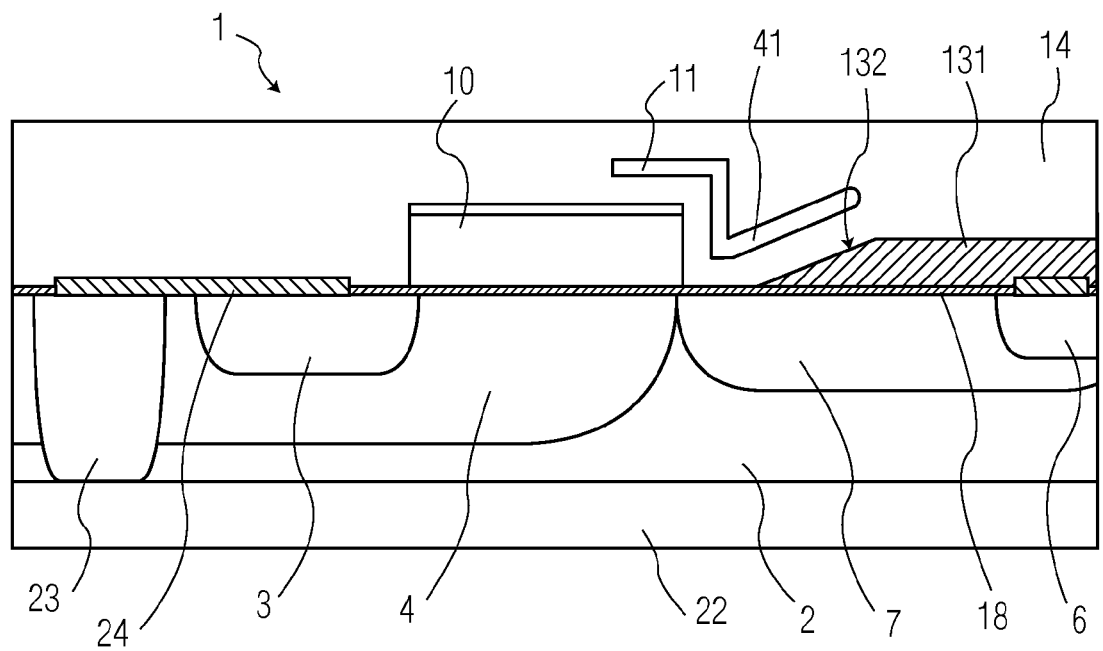

FIGS. 8A-C show diagrammatical cross-sectional views depicting another method of fabricating an LDMOS transistor according to an embodiment of the invention; and FIG. 9 shows a diagrammatical cross-sectional view depicting a further method of fabricating an LDMOS transistor according to an embodiment of the invention.

The Figures are not drawn to scale. In general, identical components are denoted by the same reference numerals in the figures.

Figure 1:
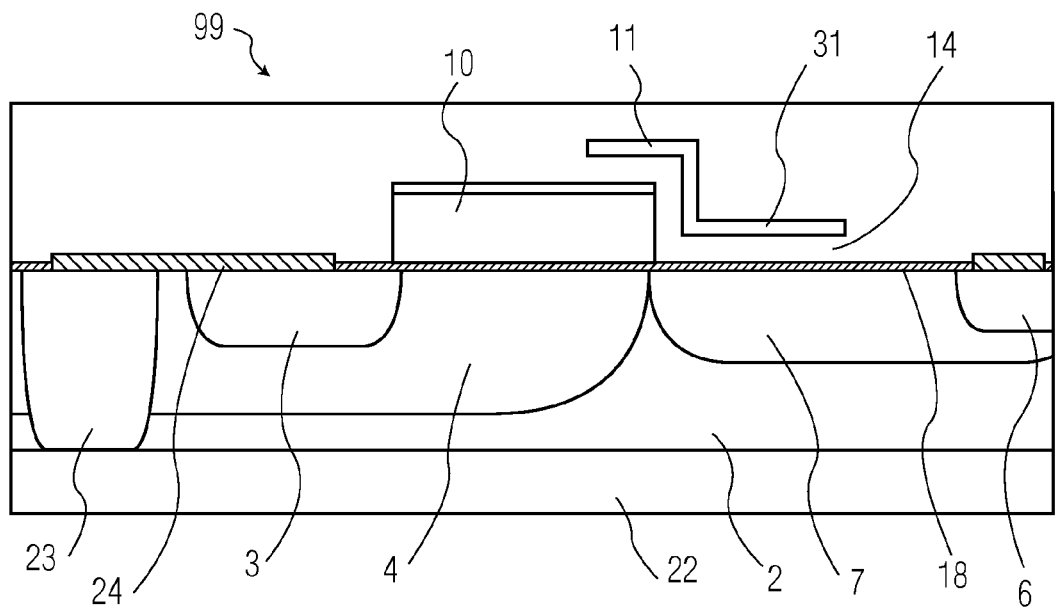
FIG. 1 shows a diagrammatical cross-sectional view of an LDMOS transistor according to the prior art.

FIG. 1 depicts a cross-sectional view of a conventional LDMOS transistor 99 according to the prior art. The LDMOS transistor 99 comprises a substrate 22 and an epitaxial substrate region 2 both of a semiconductor material which is in this case p-type silicon. The LDMOS transistor 99 further comprises a silicided polysilicon gate electrode 10, which extends over a p-type channel region 4, an n-type source region 3 and an n-type drain extension region 7, the latter two being mutually connected through the p-type channel region 4, and an n-type drain contact region 6 adjacent to the drain extension region 7. The channel region 4, the source region 3, the drain extension region 7 and the drain contact region 6 are provided in the epitaxial substrate region 2. The channel region 4 is, in this example, a laterally diffused p-type region surrounding the source region 3, hence this example provides for a MOS transistor of the LDMOS type. Adjacent to the source region 3 a p-type substrate contact region 23 is provided which electrically connects to the substrate 22. Furthermore, in this example the source region 3 and the substrate contact region 23 are mutually electrically connected with a first interconnect layer 24, which is for example a metal silicide layer. It should be noted that it also possible to apply standard interconnect vias and metal layers to interconnect the source region 3 and the substrate contact region 23. The first interconnect layer 24 is in this example also provided on a portion of the drain contact region 6. The gate electrode 10 is isolated from the epitaxial substrate region 2 by a gate oxide layer 18, which for example comprises thermally grown silicon dioxide.

The n-type drain extension region 7 enables a high voltage operation of the LDMOS transistor 99, and on the n-type drain contact region 6 an electrical contact to an interconnect structure is provided (not shown). The drain extension region 7 has a lower doping level than the drain contact region 6 and is optimized for a maximum output power of the LDMOS transistor 99. The drain extension region 7 may comprise a first drain extension sub-region and a second drain extension sub-region (not shown), which sub-regions are relatively lowly doped n-type regions.

The LDMOS transistor 99 according to the prior art further comprises a shield layer 11, which serves as a dummy gate electrode and gives a better trade-off between lifetime and RF performance. The shield layer 11 comprises a conductive material, such as tungsten, silicide or highly doped silicon. The shield layer 11 extends in this case over a portion of the gate electrode 10 and a first portion 31 of the shield region 11 extends over a part of the drain extension region 7. The shield layer 11 is electrically isolated from the gate electrode 10 by an isolation layer 14, which for example comprises a plasma oxide. The first portion 31 of the shield layer 11 is in this case isolated from the epitaxial substrate region 2, and hence the drain extension region 7, by the gate oxide layer 18 and the isolation layer 14.

Figure 2:
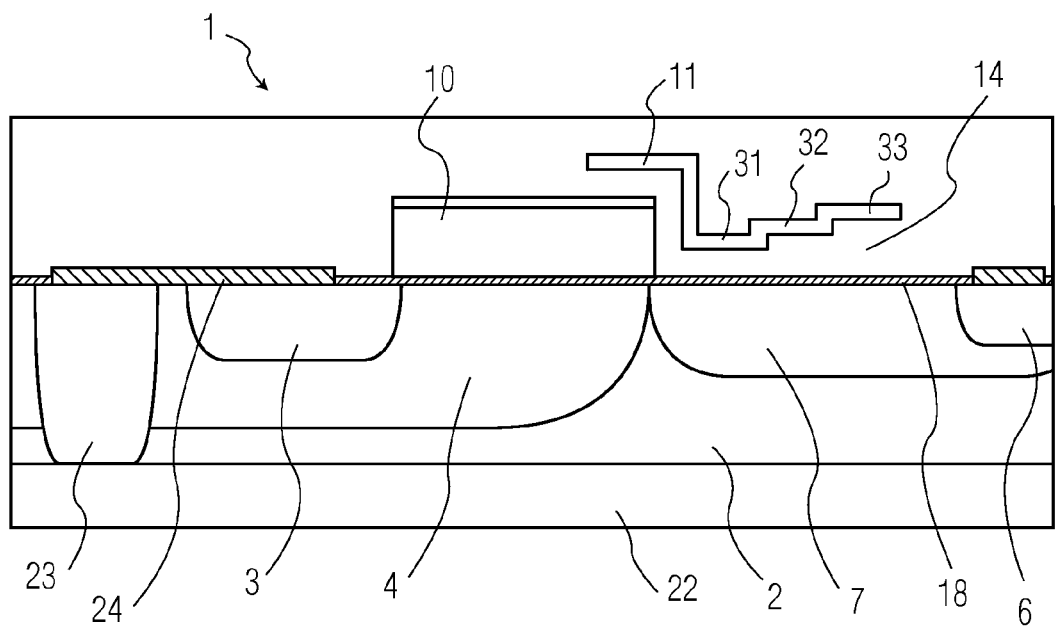
FIG. 2 shows a diagrammatical cross-sectional view of an LDMOS transistor according to an embodiment of the invention.

FIG. 2 depicts a cross-sectional view of a first embodiment of an LDMOS transistor 1 according to the invention. The LDMOS transistor 1, similar to the LDMOS transistor 99 of the prior art, comprises the substrate 22, the epitaxial substrate region 2, the gate electrode 10, the shield layer 11 with a first portion 31 extending over a part of the drain extension region 7, the isolation region 14, the channel region 4, the substrate contact region 23, the source region 3, the drain contact region 6 and the first interconnect layer 24. In this example, as in the case of the prior art, the channel region 4 is laterally diffused and hence the MOS transistor 1 is of the LDMOS-type. It should be noted that the drain extension region 7 may comprise only one doping level or multiple different-type doping levels, for example a first drain extension sub-region and a second drain extension sub-region (not shown). The main difference between the LDMOS transistor 1 according to the invention and the LDMOS transistor 99 of the prior art is that the shield layer 11 of the LDMOS transistor 1 comprises a second portion 32 and, in this case, a third portion 33 that each extend over another part of the drain extension region 7 and are essentially parallel to a top surface of the drain extension region 7. Furthermore, the distance between the second portion 32 and the drain extension region 7 is larger than the distance between the first portion 31 and the drain extension region 7, and the distance between the third portion 33 and the drain extension region 7 is larger than the distance between the second portion 32 and the drain extension region 7. Furthermore, the first portion 31 is closer to the gate electrode 10 than the second portion 32, which in its turn is closer to the gate electrode 10 than the third portion 33. The second portion 32 and the third portion 33 of the shield layer 11 influence the lateral electric field in the drain extension region 7 such that the lateral breakdown voltage increases with respect to the shield layer 11 of the prior art which only comprises the first portion 31. It should be noted that, in the case that the shield layer 11 only comprises the first portion 31 and the second portion 32, the lateral breakdown voltage also increases, but it has been found that adding the third portion 33 to the shield layer 11 increases the lateral breakdown voltage even further. Adding a fourth portion to the shield layer 11 adjoining the third portion 33, in which the distance between the fourth portion and the drain extension region 7 is larger than the distance between the third portion 33 and the drain extension region 7, results in a minor increase of the lateral breakdown voltage. Hence, the fourth portion may be added to the shield layer 11 when a further (minor) improvement is required, however the embodiment with three portions 31,32,33 may be chosen as a trade-off between a sufficient increase of the lateral breakdown voltage and the cost of additional process steps to provide for a fourth portion.

The shield layer 11 may be electrically connected (not shown) to enable applying a voltage to the shield layer 11. The voltage applied to the shield layer 11 adds a degree of freedom for influencing the lateral electric field in the drain extension region 7, which optimizes the lateral breakdown voltage of the LDMOS transistor 1. Optionally the shield layer 11 may be electrically connected to the source region 3 for example through a via contact (not shown), thereby reducing the amount of voltages to be applied to the LDMOS transistor 1.

Furthermore, the third portion 33 of the shield layer 11 may also extend partly over the drain contact region 6. However, in case the shield layer 11 is electrically contacted to the source region 3 and a low source to drain capacitance is required, the third portion 33 will preferably not extend over the drain contact region 6.

In a practical example the distance between the first portion 31, the second portion 32, the third portion 33 and the top surface of the drain extension region 7 is 200 nm, 400 nm and 600 nm respectively, and each portion extends 500 nm over the drain extension region 7.

Figure 3:
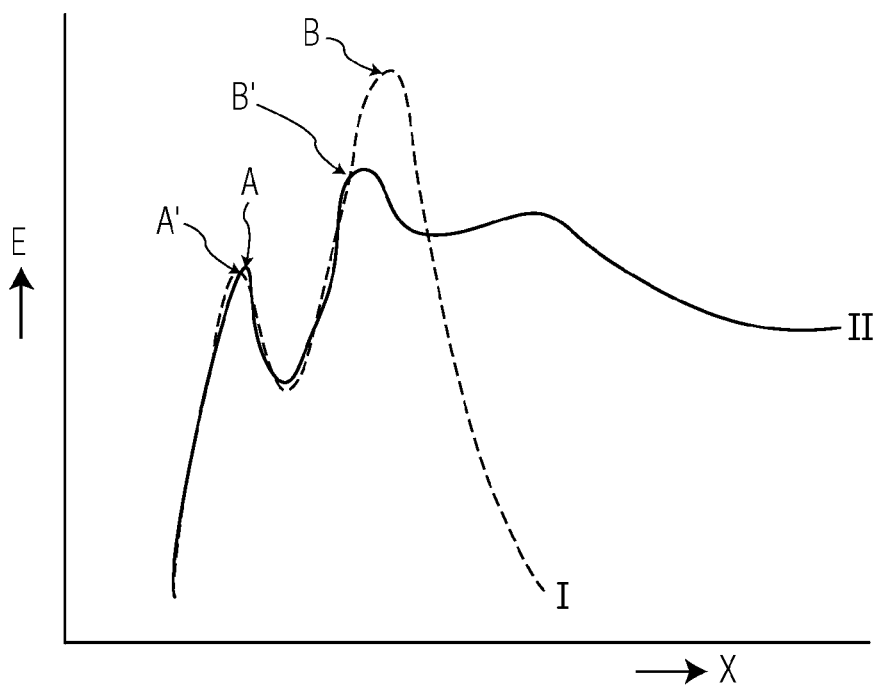
FIG. 3 shows the electric field distribution along the surface of the substrate region in the drain extension region at the maximum supply voltage and at a constant gate voltage.

The electric field distribution in the drain extension region 7 of the LDMOS transistor 1 and the LDMOS transistor 99 of the prior art is shown in FIG. 3, in which the lateral electric field E is shown at the surface of the epitaxial substrate region 2 in the channel region 4 and in the drain extension region 7 as a function of a distance X from the source region 3 measured at a constant gate voltage and a maximum supply voltage. Dotted curve I represents the electric field distribution of the LDMOS transistor 99 of the prior art and curve II represents the electric field distribution of the LDMOS transistor 1. The lateral electric field E of the LDMOS transistor 1 exhibits a first peak A' and a second peak B'. The first peak A' of the lateral electric field E is located near the position where the channel region 4 and the drain extension region 7 adjoin, and the second peak B' of the lateral electric field E is located near the position where the first portion 31 and the second portion 32 of the shield layer 11 adjoin. Similarly the lateral electric field E of the LDMOS transistor 99 of the prior art exhibits a first peak A and a second peak B, located near the first peak A' and the second peak B' respectively of the LDMOS transistor 1. The second peak B' of the lateral electric field of the LDMOS transistor 1 has a lower value than the second peak B of the lateral electric field of the LDMOS transistor 99. Furthermore the electric field of the LDMOS transistor 1 shows less variation in a region between the second peaks B' and B and the drain contact region 6 than the electric field of the LDMOS transistor 99. Thus the second portion 32 and the third portion 33 result in a lower value of the second peak B' and in a more constant electric field distribution in the drain extension region 7. These two changes of the lateral electric field in the drain extension region 7 are beneficial for the lateral breakdown of the LDMOS transistor 1 and result in an increase of the lateral breakdown voltage of the LDMOS transistor 1.

In fact, it has been found that the LDMOS transistor 1, as depicted in FIG. 2, shows an increase of the lateral breakdown voltage to a value of approximately 100V thereby fulfilling the ruggedness requirements for broadcast applications and enabling the operation of the LDMOS transistor at a supply voltage of 40V which further simplifies the circuit matching and increases the power range of amplifier applications. Furthermore it has been found that the bandwidth is far above the required 450 MHz for UHF broadcast applications. Using the LDMOS transistor 1 in base station applications is also beneficial for the lateral breakdown voltage and consequently improves the ruggedness. However, the improvement in base station applications is smaller than in broadcast applications because the length of the drain extension region 7, which is defined as the distance between the drain contact region 6 and the channel region 4, is smaller in base station applications. It also has been found that a supply voltage of 50V fulfills the requirements for VHF broadcast applications.

Figure 4:
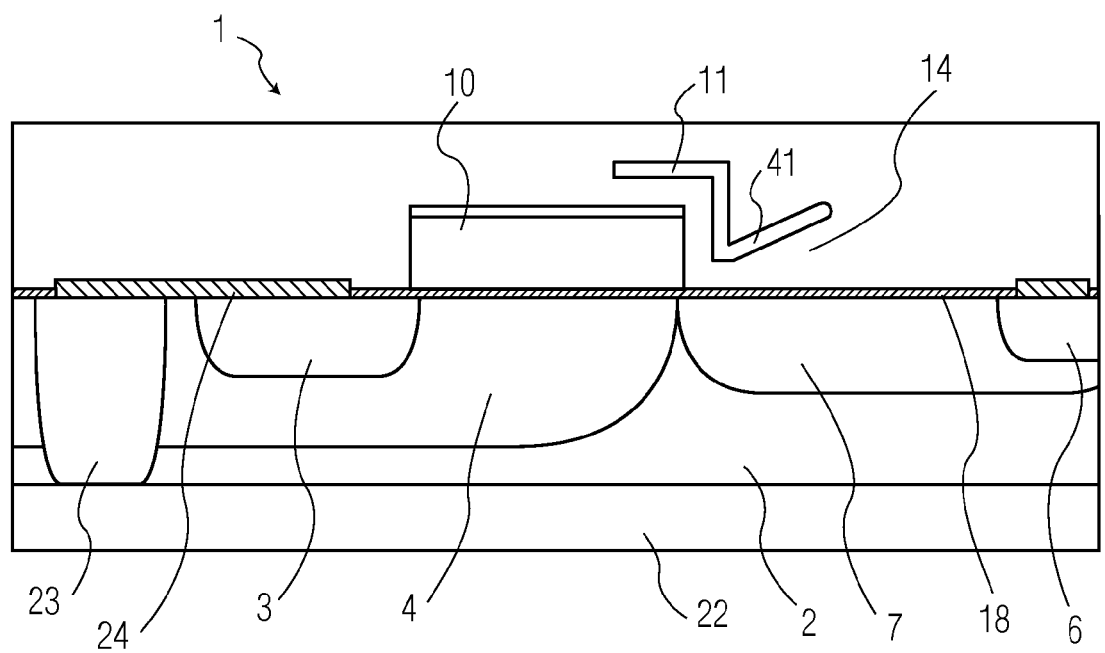
FIGS. 4-7 show diagrammatical cross-sectional views of LDMOS transistors according to embodiments of the invention.
Figure 5:
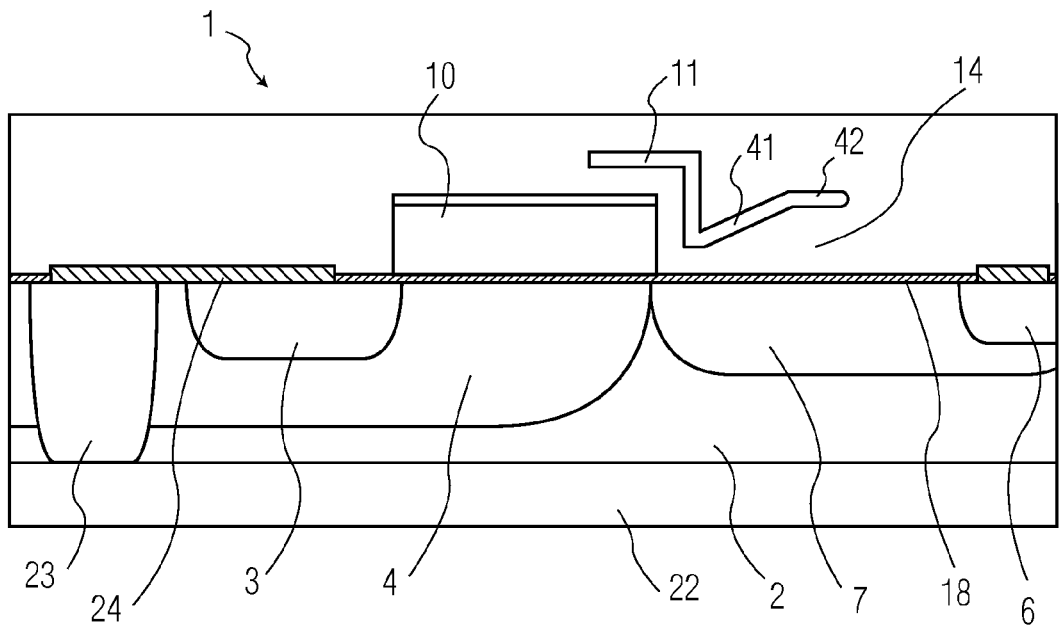

FIG. 4 depicts a cross-sectional view of another embodiment of the LDMOS transistor 1 according to the invention. In this embodiment the first portion 31 of the shield layer 11 is replaced by an inclining portion 41, wherein the distance between the inclining portion 41 and the drain extension region 7 increases linearly in a direction from the gate electrode 10 towards the drain contact region 6. This embodiment optimally influences the lateral electric field in the drain extension region 7 such that an even larger increase of the lateral breakdown is achieved with respect to the shield layer of the prior art. Additionally an end portion 42 may be added, as is depicted in FIG. 5 to further improve the distribution of the lateral electric field in the drain extension region 7.

Figure 6:
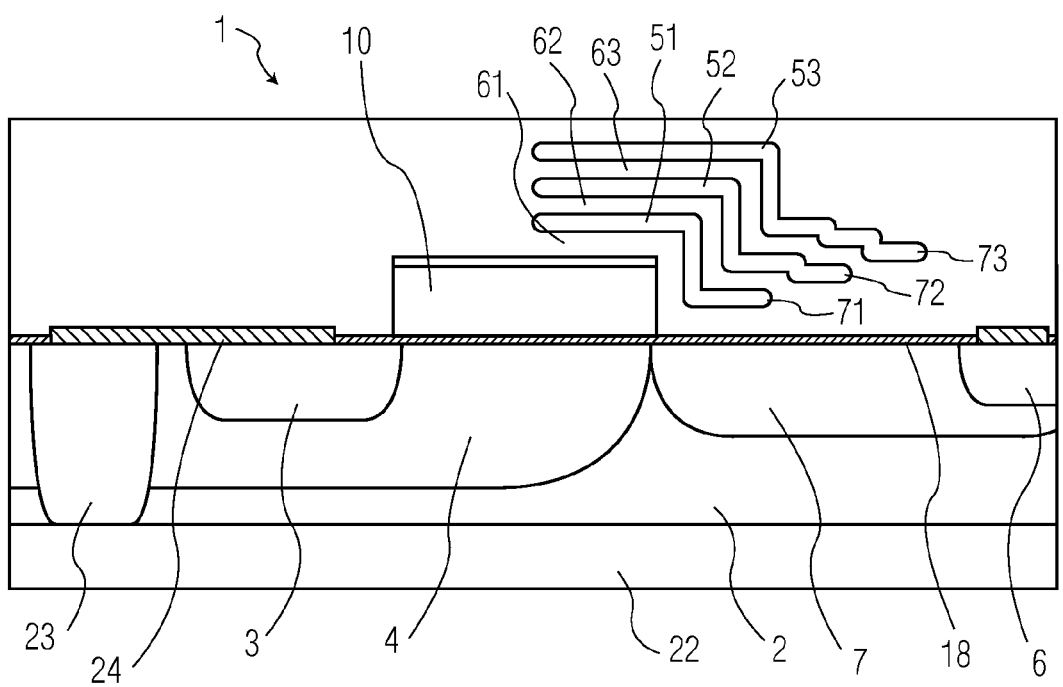

FIG. 6 depicts a cross-sectional view of another embodiment of the LDMOS transistor 1 according to the invention. In this embodiment the shield layer 11 of the LDMOS transistor 1 comprises a multiple of shield sub-layers, in this case a first shield sub-layer 51, a second shield sub-layer 52 and a third shield sub-layer 53. The shield sub-layers 51,52,53 extend in this case partly over the gate electrode 11. The first shield sub-layer 51 is electrically isolated from the gate electrode 10 and the drain extension region 7 by a first isolation layer 61, the second shield sub-layer 52 is electrically isolated from the first shield sub-layer 51 by a second isolation layer 62, and the third shield sub-layer 53 is electrically isolated from the second shield sub-layer 52 by a third isolation layer 63. In order to achieve an increase of the lateral breakdown voltage, the shield sub-layers 51,52,53 comprise end portions 71,72,73 respectively that extend over the drain extension region 7 and are essentially parallel to the top surface of the drain extension region 7. The distance between the end portion 71 of the first shield sub-layer 51 and the drain extension region 7 is smaller than the distance between the end portion 72 of the second shield sub-layer 52 and the drain extension region 7, and the distance between the end portion 72 of the second shield sub-layer 52 and the drain extension region 7 is smaller than the distance between the end portion 73 of the third shield sub-layer 53 and the drain extension region 7. Furthermore, the end portion 73 of the third shield sub-layer 53 is further from the gate electrode 10 and closer to the drain contact region 6 than the end portion 72 of the second shield sub-layer 52, and the end portion 72 of the second shield sub-layer 52 is further from the gate electrode 10 and closer to the drain contact region 6 than the end portion 71 of the first shield sub-layer 51. This embodiment also achieves a similar improvement of the lateral breakdown voltage as the previously described embodiments.

Figure 7:
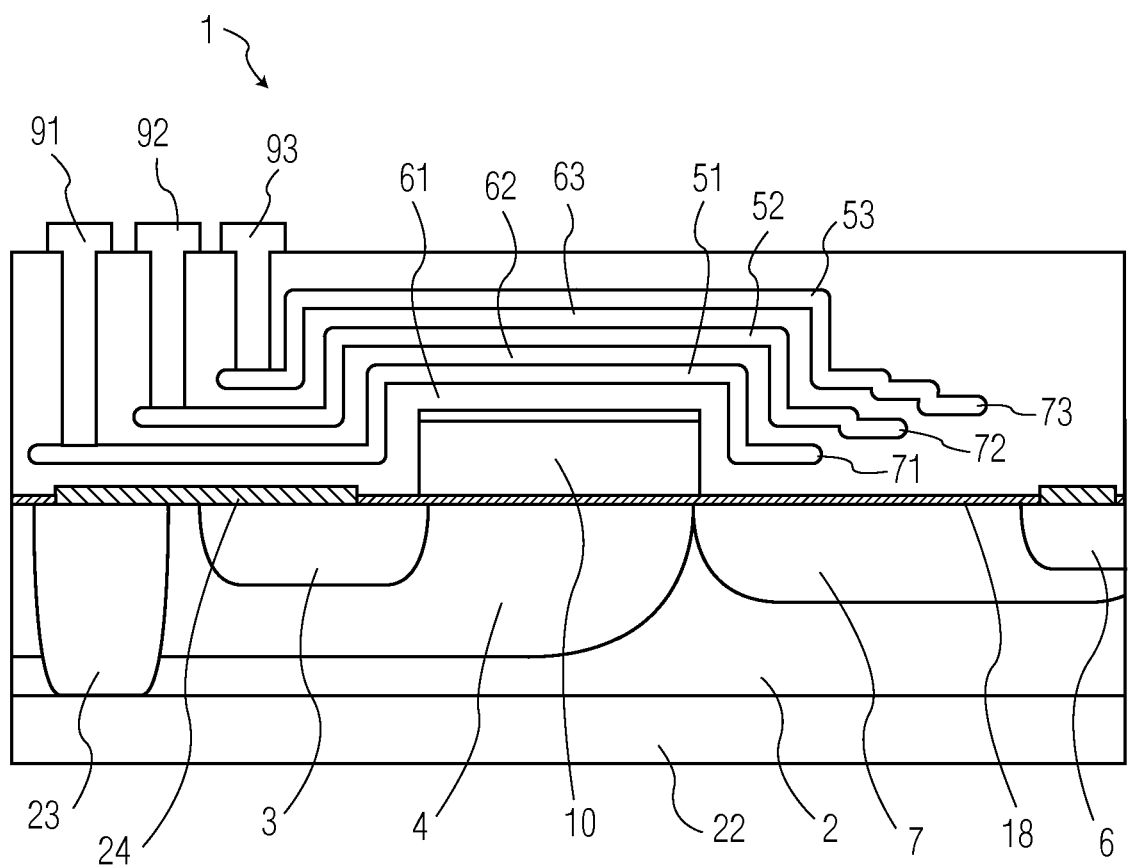

FIG. 7 shows a cross-sectional view of another embodiment of the LDMOS transistor 1 according to the invention. In this embodiment the shield sub-layers 51,52,53 extend over the gate electrode 11 and at least partly over the source region 3 and the drain extension region 7. Furthermore, the source region 3 and the substrate contact region 23 are mutually electrically connected with the first interconnect layer 24. A contact to the first interconnect layer 24 may be made on a location which is outside the plane of the cross-section of FIG. 7. This way of interconnecting the source region 3 and the substrate contact region 23 enables having a first shield layer contact 91, a second shield layer contact 92 and a third shield layer contact 93 to electrically connect to the first shield sub-layer 51, the second shield sub-layer 52 and the third shield sub-layer 53 respectively. The first, second and third shield sub-layer contacts 91,92,93 provide for a possibility to apply a voltage to the first, second and third shield sub-layers 51,52,53 respectively, thereby optimally influencing the distribution of the lateral electric field in the drain extension region 7 and further increasing the lateral breakdown voltage.

Optionally the first, second and third shield layer contacts 91,92,93 are electrically contacted to the first interconnect layer 24, thereby reducing the amount of voltages that have to be applied to the LDMOS transistor 1.

It should be noted that the shield layer 11 may also have other advantageous shapes, for example a combination with the stepped structure of the prior art WO 2005/022645 improves the current capability and the on-resistance of the LDMOS transistor 1.

FIGS. 8A-C show cross-sectional views illustrating a method for fabricating a MOS transistor according to an embodiment of the invention. FIG. 8A shows a cross-sectional view of an LDMOS transistor 1 which has been fabricated, using conventional methods, up to and including the gate electrode 10 and which comprises, amongst others, the gate oxide layer 18, the drain extension region 7 and the drain contact region 6. Now, as is shown in FIG. 8B, a staircase isolation region 121 is formed on a portion of the gate oxide layer 18 that extends over the drain extension region 7 by conventional deposition, photolithographic and etching techniques. The staircase isolation region 121 comprises a first isolation region 121a and a second isolation region 122b having a thickness larger than a thickness of the first isolation region 121a. The adjoining first and second isolation regions 121a, 121b comprise an electrically isolating material, such as for example silicon dioxide. Thereafter, as is illustrated in FIG. 8C, an isolation layer 14 is deposited and a shield layer 11 is formed extending over the first isolation region 121a and at least over a part of the second isolation region 121b. The staircase isolation region 121, comprising the first and the second isolation regions 121a, 121b, provides for a distance between the shield layer 11 and the drain extension region 7 which increases in a direction from the gate electrode 10 towards the drain contact region 6. It should be noted that the staircase isolation region 121 may comprise additional isolation regions with an increasing thickness.

The staircase isolation region 121 may also be fabricated in an earlier phase of the process, for example just before the formation of the gate oxide layer 18. Standard photolithographic, oxide growth and etching techniques may be applied to form a staircase isolation region 121 that extends over the drain extension region 7.

Alternatively, as is shown in FIG. 9, an inclining isolation region 131 may be fabricated which thickness increases in a direction away from the gate electrode 10 by applying well-known etching methods which provide for a tapered sidewall 132. The slope of the tapered sidewall 132 depends, amongst others, on the resist and polymers that cover the sidewall 132 during etching and on the subsequent furnace curing parameters, such as temperature and time.

In summary, the MOS transistor of the invention comprises a gate electrode, a channel region, a drain contact region and a drain extension region mutually connecting the channel region and the drain contact region. The MOS transistor further comprises a shield layer which extends over the drain extension region wherein the distance between the shield layer and the drain extension region increases in a direction from the gate electrode towards the drain contact region. In this way the lateral breakdown voltage of the MOS transistor is increased to a level at which the MOS transistor may fulfill the ruggedness requirement for broadcast applications for a supply voltage higher than that used in base station applications.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of other elements or steps than those listed in a claim. The word "a" or "an" preceding an element does not exclude the presence of a plurality of such elements.

The invention claimed is:

1. A MOS transistor comprising a semiconductor substrate region in which a source region, a channel region, a drain extension region and a drain contact region are provided, wherein the drain extension region mutually connects the drain contact region and the channel region, and wherein the channel region mutually connects the drain extension region and the source region, the MOS transistor further comprising a gate electrode, extending over the channel region, and a shield layer of an electrically conductive material, wherein the shield layer comprises a first, second and third portions configured to extend over the drain extension region and to be essentially parallel to a top surface of the drain extension region, wherein the second portion is configured to mutually connect the first portion and the third portion, wherein the first portion is closer to the gate electrode than the second portion and the second portion is closer to the gate electrode than the third portion, and wherein a distance between the drain extension region and the second portion is larger than a distance between the drain extension region and the first portion and a distance between the drain extension region and the third portion is larger than a distance between the drain extension region and the second portion.

2. A MOS transistor as claimed in claim 1, wherein the shield layer also extends over a part of the gate electrode.

3. A MOS transistor as claimed in claim 2, wherein the shield layer also extends over a part of the source region.

4. A MOS transistor as claimed in claim 3, the MOS transistor further comprising a substrate contact region, which is adjacent to the source region, wherein the substrate contact region and the source region are electrically connected via a first interconnect layer.

5. A MOS transistor as claimed in claim 1, wherein the shield layer is electrically connected to the source region.

6. A method of manufacturing a MOS transistor comprising the step of providing a semiconductor substrate region in which a source region, a channel region, a drain extension region and a drain contact region are provided, wherein the drain extension region mutually connects the drain contact region and the channel region, and wherein the channel region mutually connects the drain extension region and the source region, the method further comprising the steps of:

forming a gate oxide layer on the semiconductor substrate region, forming a gate electrode, extending over the channel region, on a first portion of the gate oxide layer, forming an isolation region on a third portion of the gate oxide layer and extending over a part of the drain extension region, the third portion of the gate oxide layer being separated from the first portion of the gate oxide layer by a second portion of the gate oxide layer, and wherein the isolation region has a thickness that increases in a direction from the gate electrode towards the drain contact region, and forming a shield layer of an electrically conductive material extending at least over a part of the second portion of the gate oxide layer and at least over a part of the isolation region, wherein the shield layer comprises a first, second and third portions configured to extend over the drain extension region and to be essentially parallel to a top surface of the drain extension region, wherein the second portion is configured to mutually connect the first portion and the third portion, wherein the first portion is closer to the gate electrode than the second portion and the second portion is closer to the gate electrode than the third portion, and wherein a distance between the drain extension region and the second portion is larger than a distance between the drain extension region and the first portion and a distance between the drain extension region and the third portion is larger than a distance between the drain extension region and the second portion.

7. A MOS transistor comprising a semiconductor substrate region in which a source region, a channel region, a drain extension region and a drain contact region are provided, wherein the drain extension region mutually connects the drain contact region and the channel region, and wherein the channel region mutually connects the drain extension region and the source region, the MOS transistor further comprising a gate electrode, extending over the channel region, and a shield layer of an electrically conductive material, wherein the shield layer comprises a first, second and third stacked shield sub-layers, wherein the second shield sub-layer extends over the first shield sub-layer and is separated from the first shield sub-layer by a first isolation layer and the third shield sub-layer extends over the second shield sub-layer and is separated from the second shield sub-layer by a second isolation layer, wherein the second shield sub-layer extends over a larger part of the drain extension region than the first shield sub-layer and the third shield sub-layer extends over a larger part of the drain extension region than the second shield sub-layer, and wherein a distance between the second shield sub-layer and the drain extension region is larger than a distance between the first shield sub-layer and the drain extension region and a distance between the third shield sub-layer and the drain extension region is larger than a distance between the second shield sub-layer and the drain extension region.

8. A MOS transistor as claimed in claim 7, wherein the shield layer also extends over a part of the gate electrode.

9. A MOS transistor as claimed in claim 8, wherein the shield layer also extends over a part of the source region.

10. A MOS transistor as claimed in claim 9, the MOS transistor further comprising a substrate contact region, which is adjacent to the source region, wherein the substrate contact region and the source region are electrically connected via a first interconnect layer.

11. A MOS transistor as claimed in claim 7, wherein the shield layer is electrically connected to the source region.

12. A MOS transistor as claimed in claim 7, wherein the third shield sub-layer extends over both the second shield sub-layer and the first shield sub-layer.

\* \* \* \* \*